United States Patent [19]

Nagaoka

[11] Patent Number: 5,045,919
[45] Date of Patent: Sep. 3, 1991

[54] PLASTIC PACKAGED SEMICONDUCTOR DEVICE HAVING BONDING WIRES WHICH ARE PREVENTED FROM COMING INTO CONTACT WITH EACH OTHER IN PLASTIC SEALING STEP

[75] Inventor: Tetsuya Nagaoka, Yokohama, Japan

[73] Assignee: Kabushiki Kaisha Toshiba, Kawasaki, Japan

[21] Appl. No.: 579,664

[22] Filed: Sep. 10, 1990

[30] Foreign Application Priority Data

Sep. 12, 1989 [JP] Japan .................. 1-236408

[51] Int. Cl.⁵ .................................... H01L 23/48
[52] U.S. Cl. .............................. 357/72; 357/70
[58] Field of Search .................. 357/70, 68, 72; 437/217, 220, 206

[56] References Cited

U.S. PATENT DOCUMENTS 4,258,381  3/1981  Inaba ....................... 357/70

FOREIGN PATENT DOCUMENTS 8602200  4/1986  European Pat. Off. ............. 357/70
0046041  3/1985  Japan ................................... 357/70
0216565  8/1989  Japan ................................... 357/70

*Primary Examiner*—Rolf Hille
*Assistant Examiner*—S. V. Clark
*Attorney, Agent, or Firm*—Finnegan, Henderson, Farabow, Garrett and Dunner

[57] ABSTRACT

Bonding pads for deriving out electrodes of semiconductor elements formed on a pellet to the exterior are formed on the pellet. The pellet is mounted on a bed. Inner lead portions of a lead frame are arranged on the surrounding portion of the bed to extend radially away from the bed. A distance between those of the inner lead portions which are disposed in position corresponding to the corner portion of the bed is set larger than a distance between those of the inner lead portions which are disposed in the other position. The bonding pads are electrically connected to the inner lead portions by means of bonding wires. The pellet, bed, inner lead portions and bonding wires are sealed into a plastic package.

5 Claims, 3 Drawing Sheets

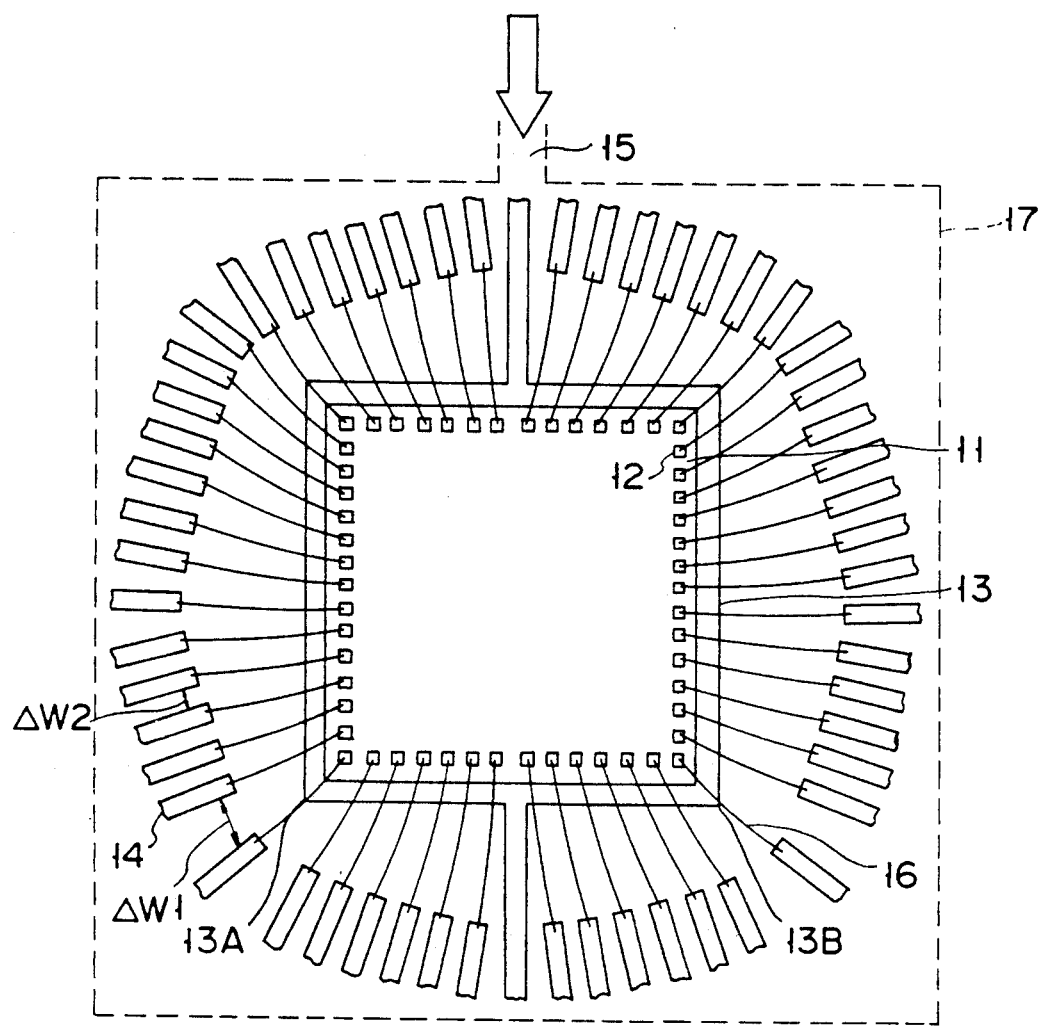
F I G. 1

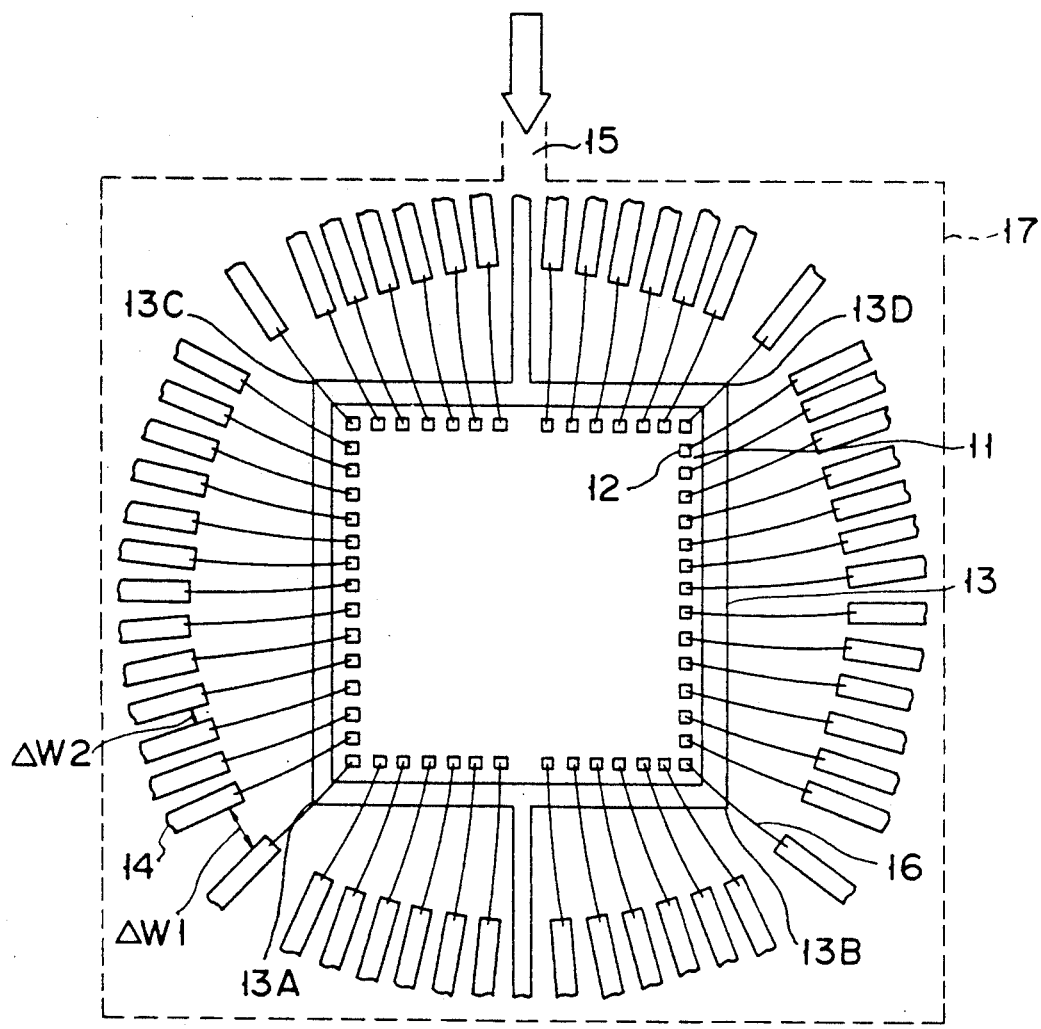
F I G. 2

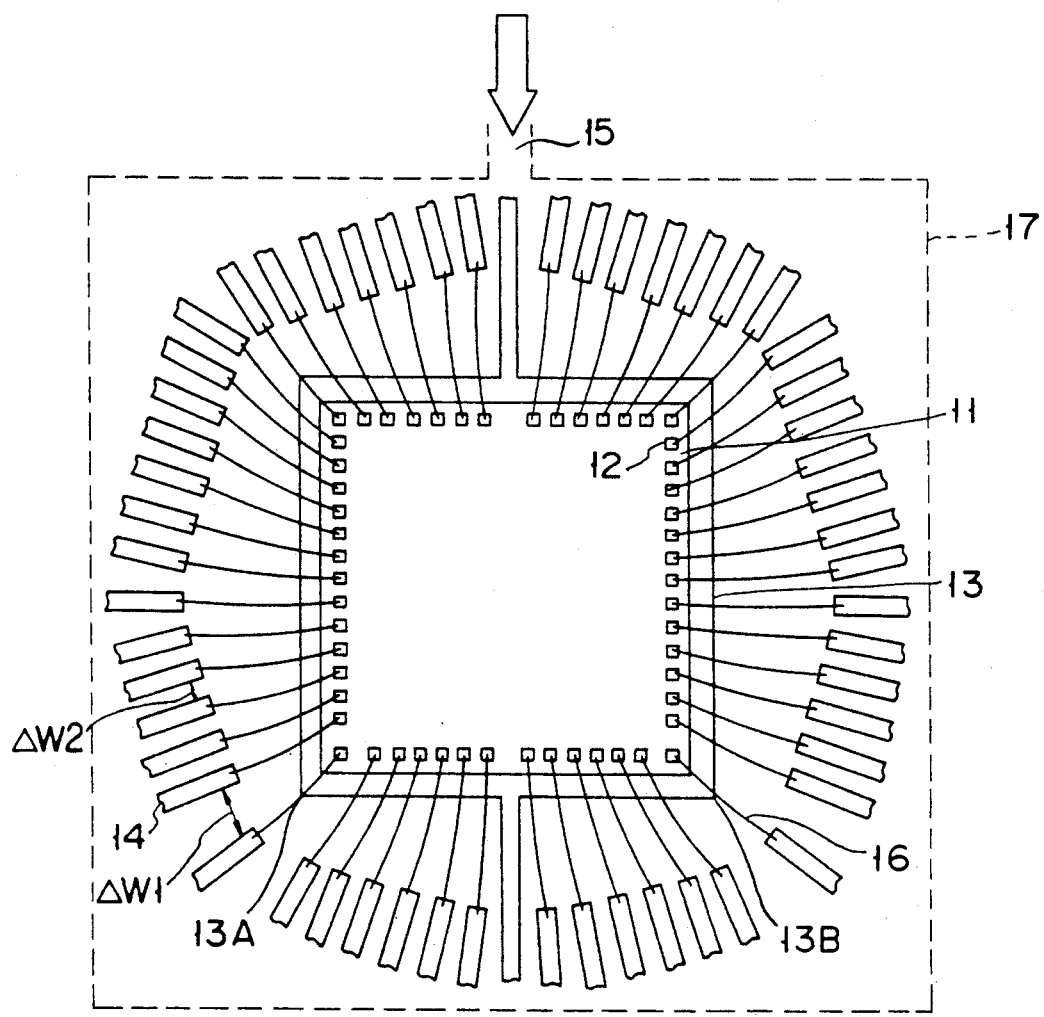
F I G. 3

PLASTIC PACKAGED SEMICONDUCTOR DEVICE HAVING BONDING WIRES WHICH ARE PREVENTED FROM COMING INTO CONTACT WITH EACH OTHER IN PLASTIC SEALING STEP

BACKGROUND OF THE INVENTION

1. Field of the Invention

This invention relates to a plastic packaged semiconductor device, and more particularly to a semiconductor device having bonding wires which are prevented from coming into contact with each other in a plastic sealing step.

2. Description of the Related Art

A plastic packaged semiconductor device is manufactured by mounting a pellet having semiconductor elements thereon on the bed of a lead frame and effecting a wire bonding step and a plastic packaging step by use of the transfer mold method. The lead frame may vary in construction according to the form of the package, the number of pins and the like, but is generally formed to have a plurality of inner lead portions which are formed on the surrounding portion of the bed acting as a support of the pellet to extend radially away from the bed and the bed is supported by tie bars. The bed is formed in a square or rectangular form which is similar to the form of the pellet and free ends of the inner lead portions are arranged on the surrounding portion thereof. The free ends of the inner lead portions and the bonding pad on the pellet are electrically connected to each other via bonding wires. The pellet, bed, inner lead portions and bonding wires are sealed in a plastic package. Outer lead portions which are connected to the inner lead portions are derived out to the exterior of the package.

In the semiconductor industry, it is desired to enhance the integration density, attain multifunction and lower the cost. In order to enhance the integration density and attain multifunction, the number of pins tends to increase, and at the same time, in order to lower the cost, the pellet size tends to be made smaller. As a result, a large number of bonding pads are formed on a small-sized pellet, and as a matter of course, a pitch between the bonding pads becomes smaller. At present, the pitch is formed to be approx. 200 μm, but it is found that the following phenomenon will occur if it is formed to be less than 160 μm. That is, if the plastic sealing step is effected under this condition, the bonding wire is forcedly flowed by gel plastic injected into a cavity mold so as to be made in contact with an adjacent bonding wire or the bonding pad. In particular, the bonding wire which is connected near the corner portion of the bed in position far apart from the injection port for the gel plastic is arranged with an acute angle with respect to the direction of arrangement of the bonding pads (the side of the bed) so that a distance to an adjacent bonding wire therefrom becomes small and it may be easily set into contact with the adjacent bonding wire. Further, at or around this portion, the injected gel plastic is being solidified and the flowability thereof is lowered than at a portion near the injection port so that a pressure applied to the bonding wire will become larger than that at the portion near the injection port, causing the bonding wire to be easily flowed.

SUMMARY OF THE INVENTION

An object of this invention is to provide a plastic packaged semiconductor device in which the possibility of short-circuit between bonding wires in a plastic sealing step can be suppressed.

The above object can be attained by a plastic packaged semiconductor device comprising a pellet having semiconductor elements formed thereon and bonding pads for deriving out electrodes of the semiconductor elements to the exterior; a bed on which the pellet is mounted; inner lead portions arranged on the surrounding portion of the bed to radially extend away from the bed with a distance between the inner lead portions disposed in position corresponding to the corner portion of the bed being set larger than that between the inner lead portions disposed in the other position; bonding wires for electrically connecting the bonding pads to the inner lead portions and a plastic package for sealing the pellet, bed, inner lead portions and bonding wires.

With the above construction, since a distance between the inner lead portions in position corresponding to the corner portion of the bed in which the bonding wires tend to come into contact with each other is set larger than that of the inner lead portions in the other position, it becomes difficult for the bonding wire to come into contact with another bonding wire, thereby preventing the short-circuit between the bonding wires in the plastic sealing step.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view showing a portion surrounding a mounting portion of a pellet, for illustrating a plastic packaged semiconductor device according to a first embodiment of this inventions;

FIG. 2 is a plan view showing a portion at and near a mounting portion of a pellet, for illustrating a plastic packaged semiconductor device according to a second embodiment of this inventions; and FIG. 3 is a plan view showing a portion surrounding a mounting portion of a pellet, for illustrating a plastic packaged semiconductor device according to a third embodiment of this inventions.

DETAILED DESCRIPTION OF THE PREFERRED EMBODIMENTS

In FIG. 1, a portion at and near a mounting portion of the pellet of a plastic packaged semiconductor device according to a first embodiment of this inventions is shown. Bonding pads 12 are disposed at a regular interval with a pitch of less than 160 μm on the surface of the pellet 11 on which semiconductor elements are formed along the four sides thereof. The bonding pads 12 are of Al or Al alloy such as Al-Si or Al-Si-Cu and are electrically connected to active regions, electrodes, wirings and the like which are formed to constitute the semiconductor elements. The pellet 11 is mounted on a bed 13 by use of conductive bonding agent, solder or eutectic. Inner lead portions 14 of the lead frame are arranged on the surrounding portion of the bed 13 to radially extend away from the bed 13. Although not shown in the drawing, outer lead portions of the lead frame are arranged to be lead out from one, two or four sides of a package according to the type of single in-line package (SIP), dual in-line package (DIP) or flat package. The inner lead portions 14 are so arranged that a distance $\Delta W1$ between adjacent two of the inner lead portions disposed in position near two corner portions 13A and 13B of the bed 13 which are set away from the gel plastic injection port 15 used for plastic sealing as will be described later may be set larger than a distance $\Delta W2$ between them in the other position. The lead frame and the bed 13 are formed by punching a plate formed of Fe, Fe-Ni, Cu, Cu alloy or the like. The outer lead portions are bent in a common direction after the plastic sealing step and are inserted into holes formed in a printed-circuit board or soldered with the printed-circuit board so as to be mounted on the printed-circuit board. Bonding wires 16 are connected between the bonding pads 12 formed on the pellet 11 and the free ends of the inner lead portions 14 of the lead frame to electrically connect them. The bonding wire 16 is formed of material selected from a group consisting of Au, Al, Cu and Cu alloy. The bonding wire 16 is bonded by thermocompression on the bonding pad 12 by use of the ball bonding method or ultrasonic wave combination type ball bonding method, then moved to the free end of the inner lead portion 14 to which the bonding wire is next bonded while it is formed in preset loop form, and subjected to the Wedge bonding. In some types of the devices, a so-called turnover bonding method in which a bonding wire with a loop larger than the preset loop of the bonding wire 16 is formed by the ball bonding method may be effected.

After the above process is ended, a plastic sealing step is effected by using a mold having a cavity. That is, the inner lead portions 14 of the lead frame on which the pellet 11 is mounted is set inside the cavity (indicated by broken lines 17 in FIG. 1) and melt gel plastic is injected from the plastic injection port 15 formed in the cavity 17 to seal the pellet 11, bed 13, inner lead portions 14 and bonding wires 16 by us of plastic.

With the above construction, since the distance $\Delta W1$ between adjacent two of the inner lead portions 14 disposed to face the corner portions 13A and 13B of the bed 13 which are set away from the injection port 15 is set larger than the distance $\Delta W2$ between them in the other position, the bonding wires hardly come into contact with each other even if the bonding wire 16 is moved in the plastic sealing step. Since the bonding wires 16 disposed on the four sides of the bed are disposed substantially in parallel, adjacent bonding wires are moved in the same direction even when the bonding wire 16 is flowed in the plastic sealing step so that the bonding wires will hardly come into contact with each other even if the distance $\Delta W2$ is small. As a result, the contact of the bonding wires in the plastic sealing step can be prevented, thereby enhancing the manufacturing yield.

In the first embodiment, the distance between adjacent two of the inner lead portions 14 disposed to face the corner portions 13A and 13B of the bed 13 which are set away from the plastic injection port 15 is selectively set larger, but it is also possible to increase the distances between the inner lead portions facing all the corner portions (four corners) 13A, 13B, 13C and 13D as shown in FIG. 2.

Further, in the first and second embodiments, the pitches of the bonding pads 12 are set constant, but it is possible to selectively set only the pitches in the corner portions 13A and 13B larger (more than 160 $\mu$m) and set the pitches in the other position smaller (less than 160 $\mu$m).

What is claimed is:

1. A plastic packaged semiconductor device comprising:
    a gel plastic injection port;
    a pellet having semiconductor elements and bonding pads for leading out electrodes of the semiconductor elements to the exterior;
    a bed on which said pellet is mounted, including two corners remote from said gel plastic injection port;
    inner lead portions arranged on a portion surrounding said bed and radially extending away from said bed, a distance between those of said inner lead portions in position corresponding to the two corners remote from said gel plastic injection port being set larger than a distance between those of said inner lead portions disposed in other positions;
    bonding wires for electrically connecting said bonding pads to said inner lead portions; and
    a plastic package for sealing said pellet, bed, inner lead portions and bonding wires.

2. A plastic packaged semiconductor device according to claim 1, wherein said pellet has four sides and said bonding pads are arranged at a regular interval along the four sides.

3. A plastic packaged semiconductor device according to claim 2, wherein a distance between said bonding pads is set to be not larger than 160 $\mu$m.

4. A plastic packaged semiconductor device according to claim 1, wherein a distance between those of said bonding pads which are disposed near corner portions of said pellet is set to be larger than a distance between those of said bonding pads disposed in other positions.

5. A plastic packaged semiconductor device according to claim 1, wherein a distance between those of said bonding pads corresponding to the two corners remote from said gel plastic injection port is set to be larger than a distance between those of said bonding pads which are disposed in the other position.

* * * * *